United States Patent
Barsky et al.

(10) Patent No.: US 6,551,905 B1
(45) Date of Patent: Apr. 22, 2003

(54) WAFER ADHESIVE FOR SEMICONDUCTOR DRY ETCH APPLICATIONS

(75) Inventors: Michael E. Barsky, Sherman Oaks, CA (US); Harvey N. Rogers, Playa Del Rey, CA (US); Vladimir Medvedev, Rancho Palos Verdes, CA (US); Yaochung Chen, Rancho Palos Verdes, CA (US); Richard Lai, Redondo Beach, CA (US)

(73) Assignee: TRW Inc., Redondo Beach, CA (US)

( * ) Notice: Subject to any disclaimer, the term of this patent is extended or adjusted under 35 U.S.C. 154(b) by 0 days.

(21) Appl. No.: 09/693,716

(22) Filed: Oct. 20, 2000

(51) Int. Cl.⁷ ........................... H01L 21/30; H01L 21/46
(52) U.S. Cl. ..................... 438/459; 438/694; 438/725
(58) Field of Search ............................... 438/637, 106, 438/694, 725, 928, 974, 977, 976, 459

(56) References Cited

U.S. PATENT DOCUMENTS

| | | | |
|---|---|---|---|
| 4,818,323 A | * | 4/1989 | d'Aragona et al. .. 148/DIG. 12 |
| 5,445,692 A | * | 8/1995 | Nitta ........................... 156/286 |
| 5,587,090 A | * | 12/1996 | Belcher et al. ................ 216/17 |
| 5,656,552 A | * | 8/1997 | Hudak et al. ................ 438/107 |
| 6,096,635 A | * | 8/2000 | Mou et al. ................... 438/598 |
| 6,287,891 B1 | * | 9/2001 | Sayyah ........................ 438/106 |

FOREIGN PATENT DOCUMENTS

JP 10-294246 * 11/1998 ........... H01L/21/02

* cited by examiner

Primary Examiner—William David Coleman
(74) Attorney, Agent, or Firm—Harness, Dickey & Pierce, P.L.C.

(57) ABSTRACT

A method is provided for backside processing a semiconductor wafer (10) including applying a polymer based protective coating (16) on the wafer, depositing a barrier layer of ceramic (18) on the protective coating, and coating the ceramic layer with a thermoplastic based adhesive (20). Thereafter, the wafer (10) is bonded to a perforated substrate (22) and then lapped and polished to a desired thickness and patterned with an etch mask. A high temperature plasma etching process is then used to etch via holes in the wafer (10). After etching and subsequent backside processing, the adhesive layer (20) is dissolved in acetone to separate the wafer (10) from the substrate (22). The protective coating (16) is then dissolved with a solvent to separate the ceramic layer (18) from the finished wafer (10).

20 Claims, 2 Drawing Sheets

WAFER ADHESIVE FOR SEMICONDUCTOR DRY ETCH APPLICATIONS

BACKGROUND OF THE INVENTION

1. Technical Field

The present invention generally relates to semiconductor wafers and, more particularly, to a protective coating and adhesive for use in conjunction with semiconductor wafer dry etch applications.

2. Discussion

Semiconductor wafers are currently being used in a myriad of applications. In order to prepare the semiconductor wafer for such applications, it is often necessary to provide electrical access to the circuitry on the front side of the wafer by forming via holes through the wafer. The via holes provide electrical continuity from the backside to the front side of the wafer.

Advanced semiconductor devices often perform via hole etching using plasma techniques, where the processing temperature range is 50–250° C. In order to accomplish such etching, a protective coating is required on the front side of the wafer to provide mechanical protection. Since via hole etching is generally performed on thin wafers (25–250 $\mu$m), the wafer is mounted onto a substrate with an adhesive. The wafer can now be properly maneuvered and safely handled during the wafer thinning and via hole etch processes. However, the protective coating and mounting adhesive must be easy to remove after the wafer thinning and via hole etch process.

According to the prior art, photoresists are commonly used as a protective coating to protect the front side circuitry of the wafer during the wafer thinning and via hole etch process. However, commonly used photoresists are inadequate protective coatings during higher temperature wafer thinning or via hole etching processes since they decompose at high temperatures. Furthermore, conventional adhesives, used to bond the wafer to the substrate such as waxes and epoxy are also inadequate, since the waxes often melt and epoxy-based adhesives are extremely difficult to remove after processing at high temperatures.

In view of the foregoing, there is a need in the art for a protective coating and adhesive which are compatible with high temperature semiconductor wafer thinning and via hole etching processes.

SUMMARY OF THE INVENTION

The above and other objects are provided by a method of backside processing a semiconductor wafer including applying a polymer based protective coating on the wafer, depositing a barrier layer on the protective coating, and coating the barrier layer with a thermoplastic based adhesive or using a single layer coating that embodies the characteristics of a protective coating and an adhesive layer. Thereafter, the wafer is bonded to a substrate and then lapped and polished to a desired thickness and patterned with an etch mask. A 50–250° C. plasma etching process is then used to etch via holes in the wafer. After etching and subsequent backside processing, the adhesive layer is dissolved in an organic solvent to separate the wafer from the substrate. Thereafter, the protective coating is dissolved with an organic solvent to separate the barrier layer from the finished wafer. If a single layer coating is used, it is dissolved with an organic solvent to separate the finished wafer from the substrate.

BRIEF DESCRIPTION OF THE DRAWINGS

In order to appreciate the manner in which the advantages and objects of the invention are obtained, a more particular description of the invention will be rendered by reference to specific embodiments thereof which are illustrated in the appended drawings. Understanding that these drawings only depict preferred embodiments of the present invention and are not therefore to be considered limiting in scope, the invention will be described and explained with additional specificity and detail through the use of the accompanying drawings in which.

DETAILED DESCRIPTION OF THE PREFERRED EMBODIMENTS

The present invention is directed towards a method of etching the backside of a semiconductor wafer, but can be applied in any processing application where the processed part is bonded to a carrier. More specifically, the present invention provides a protective coating for protecting the circuitry on the front side of the semiconductor wafer during backside processing and an adhesive layer for bonding the semiconductor wafer to a substrate during backside processing. The adhesive layer is selected to withstand the high temperature, e.g., 50–250° C., experienced during via hole etching by high density plasma techniques or other processing steps. Further, the protective coating is selected to shield the front side circuitry from mechanical damage during etching and withstand the high temperature, 50–250° C., experienced during via hole etching by high density plasma techniques or other processing steps. Advantageously, both the adhesive layer and protective coating may be easily removed from the wafer after etching with a solvent. A single coating can be used as both the protective coating and adhesive layer if the properties of the single layer embody the properties of the protective coating and the adhesive layer.

Figure 1:
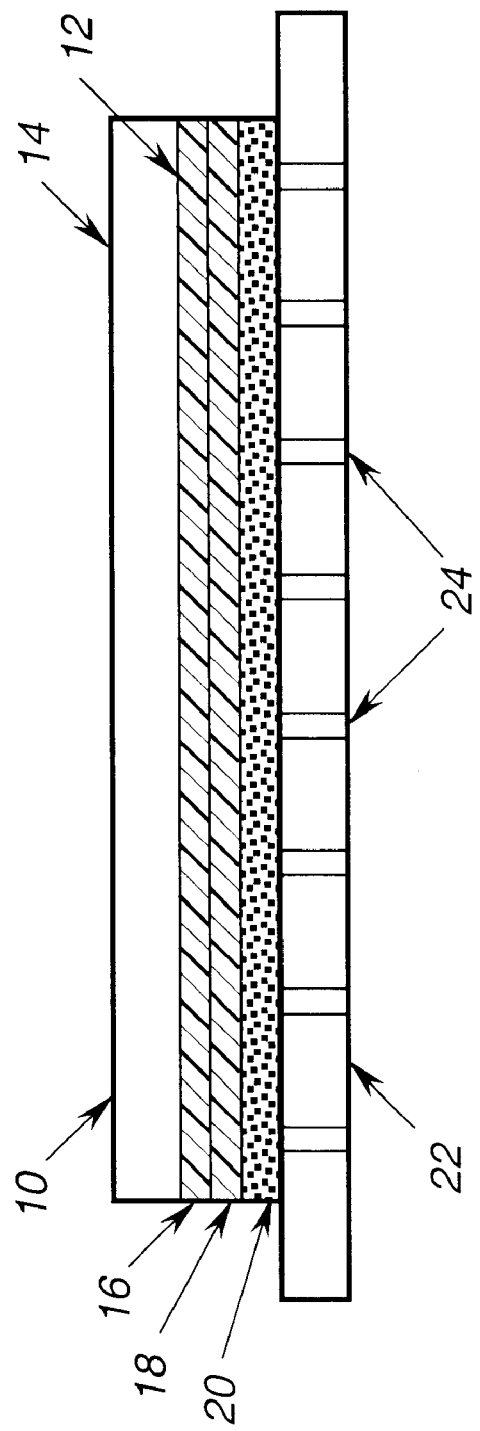
FIG. 1 is a cross-sectional view of a semiconductor wafer bonded to a substrate with a protective coating and an adhesive layer therebetween in accordance with the teachings of the present invention.

FIG. 1 illustrates a semiconductor wafer prepared for backside etching in accordance with the present invention. The semiconductor wafer 10 includes a front side 12 and a backside 14. The front side 12 includes circuitry (not shown) thereon as is known in the relevant art including airbridged metal lines and some overall wafer topology. In order to establish electrical connections with the front side circuitry, the backside 14 must undergo processing such as via hole etching, backside metallization and scribe line definition. To protect the circuitry on the front side 12 during via hole etching, the front side 12 is coated with a protective coating 16 that can withstand high temperatures typically, but not constrained to 50–250° C. The protective coating planarizes the surface of the front side 12 including any suspended structures that may exist thereon and provides a mechanical barrier to distribute applied pressures. Presently, polymer based coatings such as polymethyl methacrylate (PMMA), polydimethylglutarimide (PMGI), and others are preferred for use as the protective coating 16.

A thin film coating 18 is deposited on the protective coating 16 opposite the wafer 10. The thin film coating 18 provides a solvent barrier that is advantageous for a demounting process described below. Preferably, the thin film coating 18 (such as a plasma enhanced chemical vapor deposited silicon nitride, silicon dioxide, or other film) is deposited at a relatively low temperature so as not to damage the protective coating 16.

The thin film coating 18 is coated with an adhesive layer 20 which is compatible with high temperature etch processes. Thermoplastic adhesives are presently preferred for the adhesive layer 20 since they are capable of withstanding temperatures up to approximately 250° C. The adhesive layer 20 is bonded to a substrate 22 such that the wafer 10 may be maneuvered during a wafer thinning process prior to etching. A good thermal expansion coefficient match between the wafer 10 and substrate 22 facilitates a good bond during subsequent processing. Sapphire, sapphire patterned with holes through the substrate, silicon wafers and others have been used in III–V compound processing. Preferably, the wafer 10 is bonded to the substrate 22 at temperatures ranging from about 150 to about 200° C. for approximately 15 minutes using a vacuum bonder such that the wafer 10 and substrate 22 are pressed together by atmospheric pressure. After bonding, the adhesive layer is approximately 5–25 $\mu$m thick.

Figure 2:
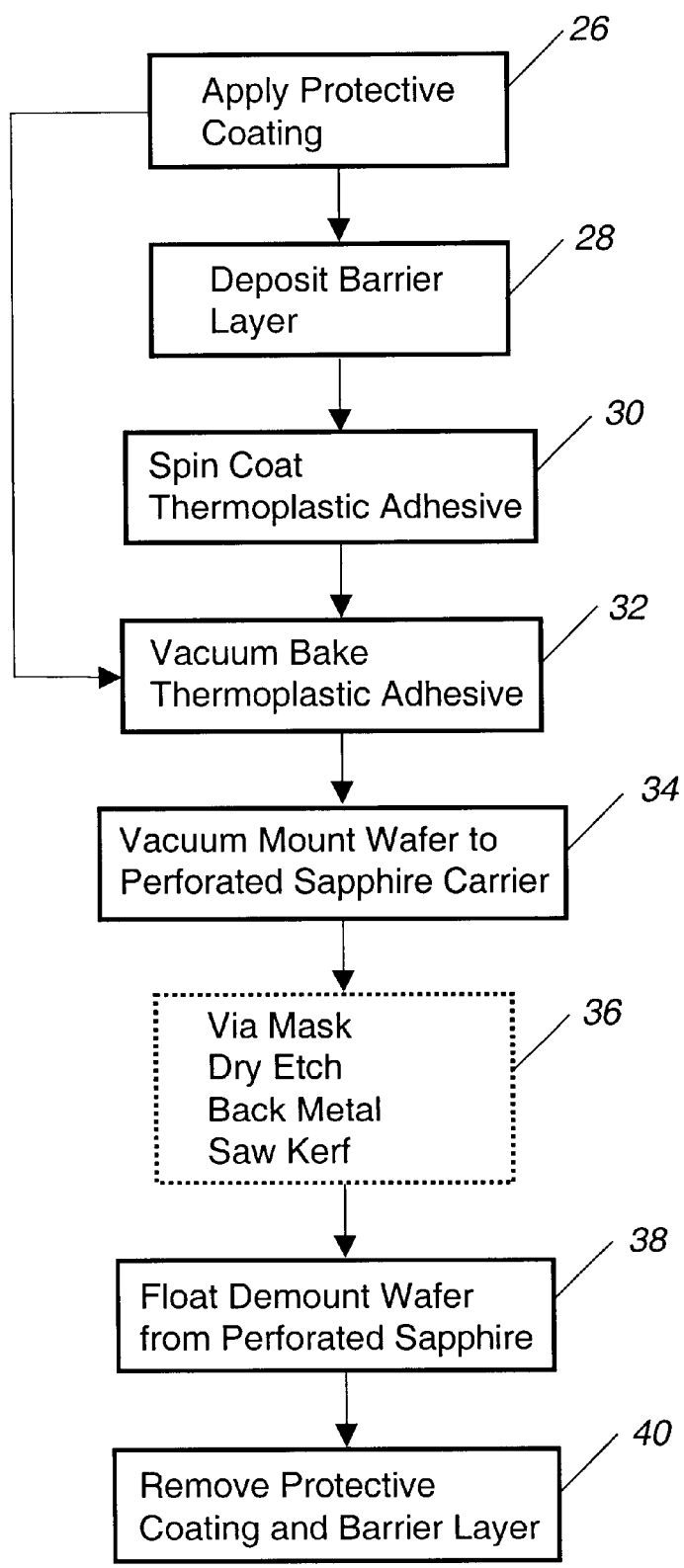
FIG. 2 is a flowchart depicting a method of etching the backside of a semiconductor wafer in accordance with the present invention.

Referring now also to FIG. 2, a method for mounting the wafer 10 to the substrate 22, etching the backside 14, and demounting the wafer 10 from the substrate 22 after etching is illustrated. In block 26 the front side 12 of the wafer 10 is coated with the protective coating 16 to protect the circuitry on the front side 12 from thermal and mechanical damage. From block 26, the methodology optionally continues to block 28 wherein the thin film coating 18 is deposited over the protective coating 16 by a relatively low temperature deposition process. If desired, block 28 can be eliminated and the process may proceed directly to block 30. If block 28 is eliminated, the process of demounting the wafer 10 from the substrate 22 may be of significantly longer duration.

After depositing the thin film coating 18 in block 28, the methodology advances to block 30 where the wafer 10 is spin coated with the adhesive layer 20 of thermoplastic. Thereafter, the methodology advances to block 32 where the wafer 10 is baked in a vacuum oven at approximately 100–180° C. for about 1–3 hours to cure the adhesive layer 20. The wafer 10 is then allowed to slowly cool to room temperature.

After vacuum baking at block 32, the methodology continues to block 34 where the wafer 10 is bonded to the substrate 22 via the adhesive layer 20. Preferably, this is accomplished using a vacuum bonder at about 150 to about 200° C. for approximately 15 minutes using atmospheric pressure. A single coating that acts as both the protective coating 16 and the adhesive layer 20 can be used in place of the protective coating 16, thin film coating 18, and adhesive layer 20. The single coating must exhibit properties consistent with the protective coating 16 and an adhesive layer 20.

From block 34, the methodology continues to block 36 where the wafer 10 is lapped and polished to the desired thickness and patterned with an etch mask. A high temperature plasma etching process is then used to etch via holes in the backside 14 of the wafer 10. Due to the presence of the protective coating 16, thin film coating 18, and adhesive layer 20 or the single layer coating as described above, etching temperatures up to about 250° C. can be employed.

After subsequent backside processing steps, the wafer 10 is ready to be separated from the substrate 22. Accordingly, from block 36 the methodology advances to block 38. In block 38, the wafer 10 is removed from the substrate 22 by float demounting using an organic solvent. For example, the wafer 10 and substrate 22 are placed in warm (approximately 40° C.) acetone for approximately 1–3 hours. Perforations 24 may be drilled through the substrate 22 prior to block 34 to allow the solvent to reach the thermoplastic adhesive layer 20 more readily. After the solvent sufficiently dissolves the adhesive layer 20 or single layer coating, the wafer 10 is separated from the substrate 22.

After demounting the wafer 10 from the substrate 22 in block 38, the methodology continues to block 40. If the single layer coating is used, the process is completed at block 38. In block 40, the protective coating 16 is removed from the wafer 10 by further soaking in solvent for approximately another 1–3 hours. When the solvent adequately dissolves the protective coating 16, the ceramic coating 18 may be lifted off the wafer 10. Advantageously, the ceramic barrier layer 18 separates the wafer demounting process into two distinct steps. This prevents the protective layer from mixing with the adhesive layer and eliminates any consequential residue. The thin film ceramic based coating is not necessary if the wafer is allowed to demount in the solvent for longer times.

Thus, a method is provided for mounting a semiconductor wafer to a substrate so that it may be subjected to high temperature processing and for removing the wafer from the substrate following etching. The method makes it possible to mount the wafer on the substrate to enable backside via hole etching by high temperature techniques without compromising the integrity of the wafer-substrate bond. Further, the wafer can then be demounted from the substrate without damaging the front side circuitry.

Those skilled in the art can now appreciate from the foregoing description that the broad teachings of the present invention can be implemented in a variety of forms. Therefore, while this invention has been described in connection with particular examples thereof, the true scope of the invention should not be so limited since other modifications will become apparent to the skilled practitioner upon a study of the drawings, specification, and following claims.

What is claimed is:

1. A method of high temperature etching a semiconductor wafer comprising the steps of:

coating said wafer with a protective coating adapted to withstand etching temperatures up to about 250° C.;

depositing a solvent barrier layer on said protective coating with one of vacuum depositing and chemical vapor depositing;

coating said solvent barrier layer with an adhesive layer adapted to withstand etching temperatures up to about 250° C.;

bonding a substrate to said adhesive layer; and etching said wafer.

2. A method of high temperature etching a semiconductor wafer comprising the steps of:

coating said wafer with a polymer based protective coating;

depositing a solvent barrier layer on said protective coating;

coating said solvent barrier layer with an adhesive layer;

bonding a substrate to said adhesive layer;

etching said wafer;

removing said adhesive layer with a solvent such that said substrate separates from said solvent barrier layer; and removing said protective coating with said solvent such that said solvent barrier layer separates from said wafer.

3. The method of claim 1 wherein said step of coating said wafer further comprises spin coating.

4. The method of claim 1 wherein said step of coating said solvent barrier layer with said adhesive layer further comprises spin coating.

5. The method of claim 1 wherein said bonding step further comprises vacuum bonding.

6. The method of claim 1 further comprising patterning said wafer with an etch mask prior to said etching step.

7. The method of claim 1 wherein said etching step further comprises etching by a high temperature plasma etching process.

8. A method of forming via holes in a semiconductor wafer using a high temperature etching comprising the steps of:

coating said wafer with a polymer based protective coating;

coating said protective coating with a solvent barrier layer;

coating said solvent barrier layer with a thermoplastic based adhesive layer;

bonding a substrate to said adhesive layer;

etching said via holes into said wafer;

removing said adhesive layer with a solvent such that said substrate separates from said barrier layer; and removing said protective coating with said solvent such that said barrier layer separates from said wafer.

9. The method of claim 8 wherein said step of coating said protective layer with said solvent barrier layer further comprises one of the group including vacuum deposition and chemical vapor deposition.

10. The method of claim 8 wherein said step of coating said solvent barrier with said adhesive layer further comprises spin coating.

11. The method of claim 8 wherein said bonding step further comprises vacuum bonding at about 150–200° C. for approximately 15 minutes.

12. A method of forming via holes in a semiconductor wafer using a high temperature etching comprising the steps of:

coating said wafer with a polymer based protective coating;

coating said protective coating with a solvent barrier layer;

coating said solvent barrier layer with a thermoplastic based adhesive layer;

bonding a substrate to said adhesive layer;

etching said via holes into said wafer;

removing said adhesive layer with a solvent such that said substrate separates from said barrier layer by placing said wafer in a warm bath of said solvent for a first period of time; and removing said protective coating with said solvent by placing said wafer in a warm bath of said solvent for a second period of time such that said barrier layer separates from said wafer.

13. A method of high temperature etching a semiconductor wafer comprising the steps of:

coating said wafer with a single layer that acts as a protective coating and an adhesive layer, said single layer being adapted to withstand etching temperatures up to about 250° C.;

bonding a substrate to said single layer; and etching said wafer;

wherein said single layer further comprises a polymer based protective coating material.

14. The method of claim 13 wherein said step of coating said wafer further comprises spin coating.

15. A method of high temperature etching a semiconductor wafer comprising the steps of coating said wafer with a single layer having polymer based protective coating and thermoplastic based adhesive layer characteristics;

bonding a substrate to said single layer;

etching said wafer; and removing said single layer coating from said water with a solvent such that said substrate is removed from said wafer.

16. A method of high temperature etching a semiconductor wafer comprising the steps of:

coating said wafer with a protective coating adapted to withstand etching temperatures up to about 250° C.;

depositing a solvent barrier layer on said protective coating;

coating said solvent barrier layer with an adhesive layer adapted to withstand etching temperatures up to about 250° C.;

bonding a substrate to said adhesive layer; and etching said wafer;

wherein said protective coating further comprises a polymer based protective coating.

17. The method of claim 16 wherein said adhesive layer further comprises a thermoplastic based adhesive layer.

18. A method of high temperature etching a semiconductor wafer comprising the steps of:

coating said wafer with a protective coating adapted to withstand etching temperatures up to about 250° C.;

depositing a solvent barrier layer on said protective coating;

coating said solvent barrier layer with an adhesive layer adapted to withstand etching temperatures up to about 250° C.;

bonding a substrate to said adhesive layer, and etching said wafer;

wherein said adhesive layer further comprises a thermoplastic based adhesive layer.

19. The method of claim 2 wherein said adhesive layer further comprises a thermoplastic based adhesive layer.

20. The method of claim 13 wherein said single layer further comprises a thermoplastic based adhesive layer material.

* * * * *